United States Patent [19]
Ogura et al.

[11] Patent Number: 5,191,512
[45] Date of Patent: Mar. 2, 1993

[54] HEAT SINK/CIRCUIT BOARD ASSEMBLY

[75] Inventors: Shinichi Ogura; Hiroo Adachi; Osamu Shishido; Tetsuya Watanabe; Yuuichi Mineo; Tohru Kageyama; Yoichi Nishiyama; Takashi Yamaguchi; Keiichi Ogawa, all of Kawagoe, Japan

[73] Assignee: Pioneer Electronic Corproation, Tokyo, Japan

[21] Appl. No.: 794,149

[22] Filed: Nov. 21, 1991

[30] Foreign Application Priority Data

Apr. 17, 1991 [JP] Japan .............................. 3-25987[U]

[51] Int. Cl.$^5$ .............................................. H05K 7/20
[52] U.S. Cl. ..................................... 361/386; 361/383
[58] Field of Search ....................... 174/16.3; 165/80.3, 165/80.4, 185; 357/81, 82, 74, 79; 361/383-389, 392, 394

[56] References Cited

U.S. PATENT DOCUMENTS 4,177,499  12/1979  Volkmann ............................ 361/388
4,916,575  4/1990  Van Asten ........................... 361/388

FOREIGN PATENT DOCUMENTS 3342923  6/1985  Fed. Rep. of Germany ...... 361/386

Primary Examiner—Gregory D. Thompson
Attorney, Agent, or Firm—Keck, Mahin & Cate

[57] ABSTRACT

A heat sink/circuit board assembly allows repairing or inspection of circuit or parts without impairing heat-radiating effect. A sub-heat sink is protruded from a lateral end of the circuit board in a direction parallel to the main surface of the circuit board and is connected to the main heat sink at its protruding portion. The diameter of the opening of the recessed portion of the main heat sink facing the circuit board is made larger than outer diameter of the circuit board. When circuit elements on the main surface of the circuit board facing the recessed portion of the main heat sink are to be repaired or inspected, the main heat sink is connected to the sub-heat sink on a main surface which is on the opposite side to the surface carrying the circuit elements, while the same heat-radiating effect as in the normal condition can be obtained.

6 Claims, 4 Drawing Sheets

HEAT SINK/CIRCUIT BOARD ASSEMBLY

BACKGROUND OF THE INVENTION

1. Field of the Invention

The present invention relates to a heat sink/circuit board assembly, which comprises a combination of a circuit board with heat-generating parts mounted thereon and a heat sink for heat radiation.

2. Description of Background Information

In electronic apparatuses using heat-generating parts such as a power transistor, which radiate relatively high heat when electric current flows, it is necessary to prevent impairment of the heat-generating parts itself by the heat or damaging other peripheral components due to thermal influence. For such a reason, the arrangement as shown in FIG. 1 has been devised.

In FIG. 1, a circuit board 32 on which a heat-generating part 31 comprising a power transistor is mounted is connected with a main heat sink 33 with a recessed portion 33a near the edge of the opening of the recessed portion through a sub-heat sink 34 of block type, which directly contacts with the heat-generating parts. On the lower surface of the circuit board 32, i.e. on the main surface opposite to the parts mounting surface where heat-generating parts 31 are mounted, printed circuit is provided, and the heat-generating parts 31 are electrically connected to the printed circuit together with the other electronic components (not shown) on the circuit board. Small screws are used to connect between the heat-generating parts 31 and the sub-heat sink 34 as well as between the sub-heat sink 34 and the main heat sink 33.

In the conventional type heat sink/circuit board assembly as described above, the positions of the heat-generating parts 1 and the other electronic components must be confirmed during inspection or repair of the circuits and parts using a tester 36 as shown in FIG. 2, and it is necessary to remove the main heat sink 33, which covers each of these components, from the other components and parts.

As the result, the circuit must be operated under the condition where only sub-heat sink 34 is connected to the heat-generating parts 31. Thus, it is difficult to sufficiently radiate the heat, and there is a possibility that the heat-generating parts 31 or peripheral components may be damaged by heat.

SUMMARY OF THE INVENTION

To eliminate such disadvantages, the object of the present invention is to offer a heat sink/circuit board assembly, by which it is possible to perform repair and inspection without impairing heat-radiating effect.

The heat sink/circuit board assembly according to the present invention comprises a circuit board with heat-generating parts mounted thereon and a main heat sink with a recessed portion, the circuit board and the main heat sink being combined together near the edge of the opening of the recessed portion via a sub-heat sink, which contacts with the heat-generating parts, and it is characterized in that the sub-heat sink is protruding from a lateral end of the circuit board in a direction parallel to main surface of the circuit board and is connected to the main heat sink at its protruding portion, and diameter of the opening of the recessed portion is larger than an outer diameter of the circuit board.

In a heat sink/circuit board assembly with such arrangement, it is possible to connect the main heat sink to the sub-heat sink facing either of the front and rear sides of the circuit board.

DETAILED DESCRIPTION OF PREFERRED EMBODIMENT

In the following, description is given on a heat sink/circuit board assembly as an embodiment of the present invention in connection with the drawings.

Figure 1:
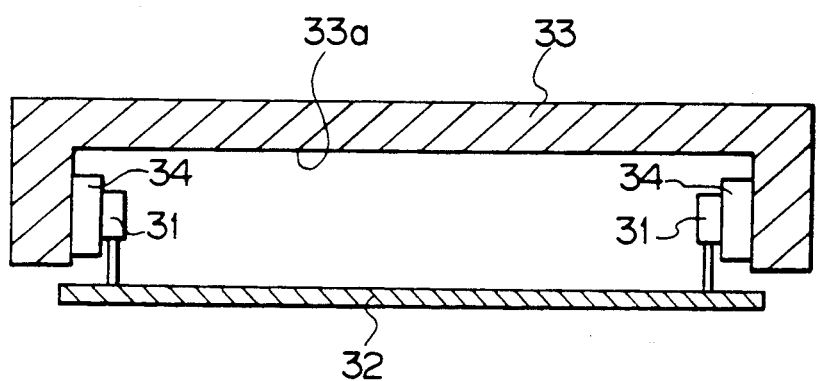
FIG. 1 is a longitudinal cross-sectional view of a conventional type heat sink/circuit board assembly.
Figure 2:
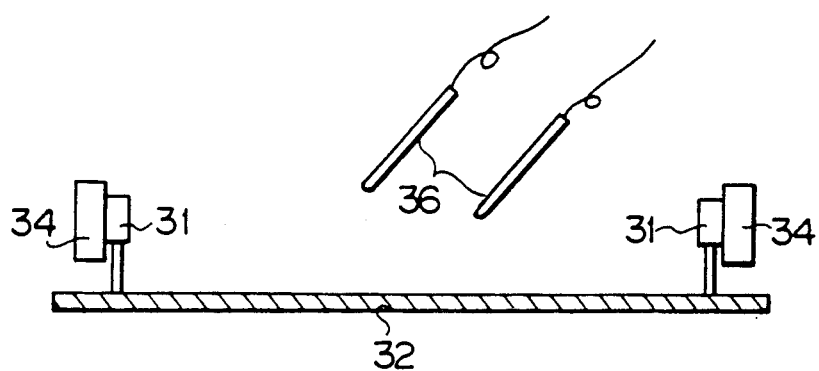
FIG. 2 is a longitudinal cross-sectional view of the heat sink/circuit board assembly of FIG. 1 when the circuit is placed for inspection or repair.
Figure 3:
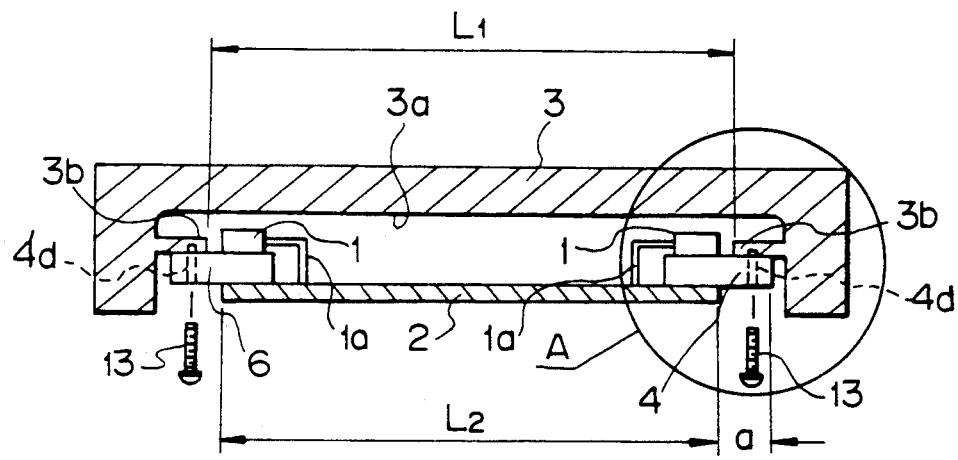
FIG. 3 is a schematic longitudinal cross-sectional view of an embodiment of the heat sink/circuit board assembly according to the present invention.
Figure 4:
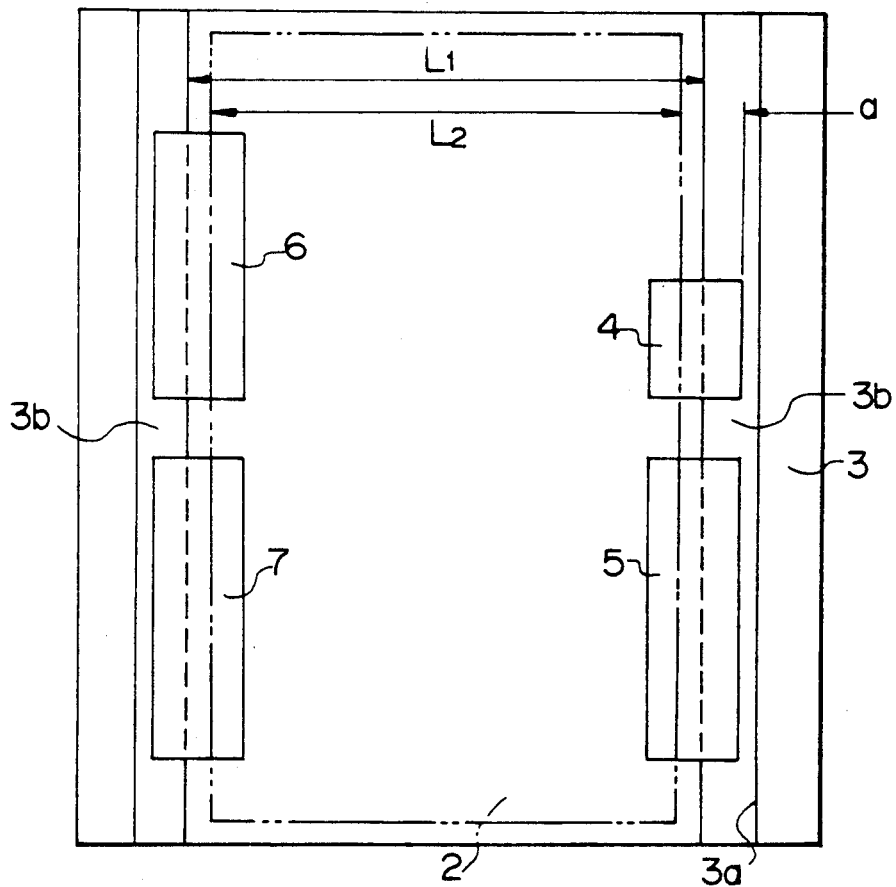
FIG. 4 is a schematic bottom view of the heat sink/circuit board assembly of FIG. 3.

FIG. 3 and FIG. 4 show the condition where the heat sink/circuit board assembly of this invention is used as a part of an electronic device. As it is evident from these two figures, in the heat sink/circuit board assembly, the heat-generating parts 1 containing power transistor or the like comprises a circuit board 2 mounted on one surface thereof, a main heat sink 3 having a recessed portion 3a, and sub-heat sinks 4 and 7, which are mounted between the circuit board and main heat sink. On the lower surface of the circuit board 2, i.e. on the main surface opposite to the parts mounting surface where heat-generating parts 1 are mounted, a printed circuit is provided. The heat-generating parts 1 are electrically connected to the printed circuit by its terminal 1a together with the other electronic components (not shown) mounted on the circuit board, and the circuit is thus formed. The main heat sink 3 is made of aluminum or its alloy, for instance.

As it is evident from the figure, these components are formed as a whole approximately in form of rectangular parallelepiped, and the recessed portion 3a is opened in three directions. The sub-heat sinks 4 and 7 directly touch the heat-generating parts 1, and the circuit board 2 and the main heat sink 3 are connected with each other near the edge of the opening of the recessed portion 3a through these sub-heat sinks. The sub-heat sinks 4 and 7 are fixed on the circuit board 2 by small screws (not shown) or by adhesive agent. Because the sub-heat sinks 4 and 7 have the configurations similar to each other, description is now given only on the sub-heat sink 4.

Figure 5:
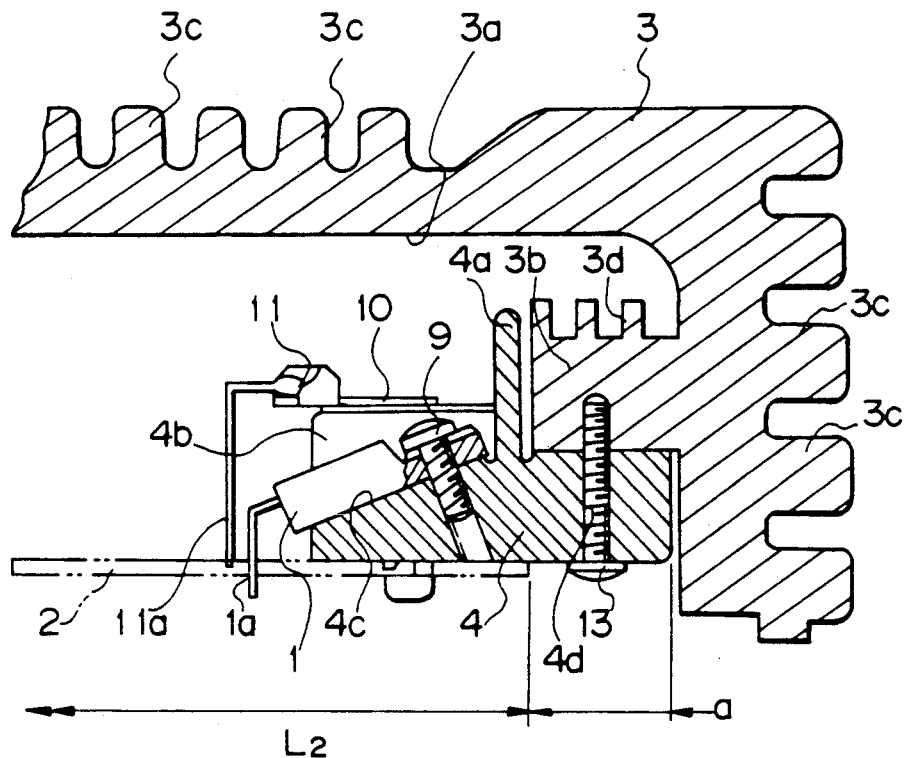
FIG. 5 is an enlarged detailed view of the portion A in FIG. 3.

FIG. 5 is an enlarged view of the portion A in FIG. 3. As shown in this figure, on left and right inner wall surfaces of the recessed portion 3a of the main heat sink 3, plate-like projections 3b are provided, and the sub-heat sink 4 is mounted on the lower surface of the projection. As shown in FIG. 5, a plurality of fins 3c are formed on outer surface of the main heat sink in order to increase the heat radiation effect. Similarly, fins 3d are formed also on the upper surface of the projections 3b.

Figure 6:
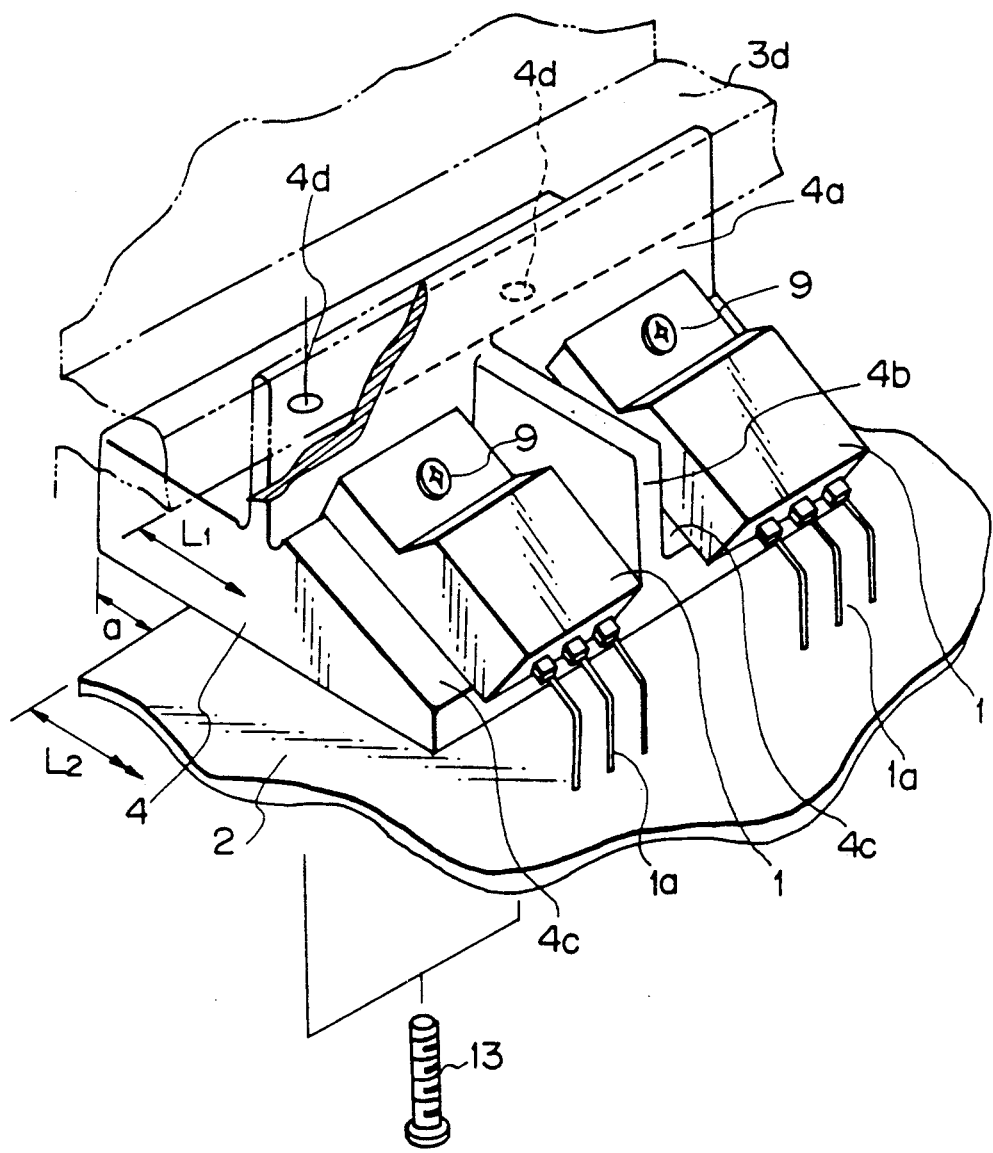
FIG. 6 is a perspective view of the essential part of the heat sink/circuit board assembly of FIG. 3 and FIG. 5 including a partial cross-section.

On the other hand, as clearly shown in FIG. 6, the sub-heat sink 4 is formed approximately in block form as a whole, and it comprises a fin 4a extending along the central axis of the sub-heat sink and protruding upward and another fin 4b, which is perpendicular to the fin 4a and is connected to the middle portion of the fin 4a. On the site defined by these two fins, a tapered plane 4c is formed, and the heat-generating part is fixed on this tapered plane by small screws 9. As shown in FIG. 5, a small circuit board 10 is mounted on fin 4b, and a heat-sensitive element 11 is mounted on the small circuit board. The terminal 11a of the heat-sensitive element is connected to the printed circuit on the circuit board 2.

As shown in FIG. 3 and FIG. 4, the diameter of the opening of the recessed portion 3a of the main heat sink 3, i.e. the width L1 between the left and right projections 3b is larger than the outer diameter of the circuit board, i.e. the width L2. Also, as shown in FIG. 5 and FIG. 6, the sub-heat sink 4 is protruding from the lateral end of the circuit board in the direction parallel to main surface of the circuit board 2, and it is connected to the main heat sink at the projection. Describing in detail, two positioning holes 4d penetrating in lateral direction of the circuit board 2 are provided on the projections, and small screws 13 inserted into the positioning holes are screwed into the projections 3b of the main heat sink.

Figure 7:
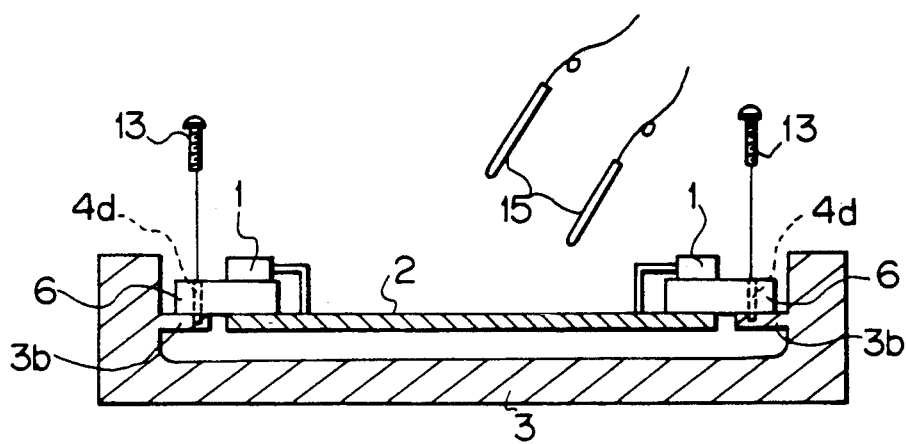
FIG. 7 is a longitudinal cross-sectional view of the heat sink/circuit board assembly of FIG. 3 and FIG. 6 when the circuit is placed for inspection or repair.

Next, description is made on the operations of inspection and repair of the circuit in the heat sink/circuit board assembly with the above arrangement with reference to FIG. 7.

In the heat sink/circuit board assembly as shown in FIG. 3 and FIG. 6, small screws 13 are loosened, and main heat sink 3 is removed from the remaining components, i.e. from the circuit board 2 and the sub-heat sink 4. Then, as shown in FIG. 7, the main heat sink thus removed is turned up side down, and it is mounted on sub-heat sink 6 from the lower side of the circuit board 2, i.e. from the side opposite to the parts mounting surface. In this case, however, small screws 13 to connect these two components may be secured only lightly. Thus, the main heat sink 3 contacts with the sub-heat sink 6, and the same heat-radiating effect as in the normal operating conditions shown in FIG. 3 is obtained. Under this condition, inspection and repair of the circuit are performed using a tester 15 or the like.

As described in detail in the above, in the heat sink/circuit board assembly according to the present invention, the sub-heat sink is protruding from lateral end of the circuit board in the direction parallel to main surface of the circuit board and is connected to the main heat sink at the projections.

Being placed to face the circuit board, the diameter of the opening of the recessed portion on the main heat sink is larger than the outer diameter of the circuit board. Therefore, the main heat sink can be connected to sub-heat sink on both front and back sides of the circuit board.

Accordingly, when circuit and parts on main surface of the circuit board on the recessed portion are repaired or inspected, main heat sink can be connected to sub-heat sink on the main surface opposite to the parts mounting side, and it is possible to perform repair or inspection without impairing heat-radiating effect.

What is claimed is:

1. A heat sink/circuit board assembly, comprising a circuit board, heat-generating parts, sub-heat sinks, and a main heat sink, said circuit board being generally rectangular and having a generally planar main surface and a lateral mounting end, said sub-heat sinks each having a mounting surface and a heat receiving surface on which is mounted substantially entirely thereon a heat-generating part, said main heat sink having a recessed portion therein the opening of which is larger than an outer diameter of said circuit board, and a protruding portion extending into said recessed portion, each of said sub-heat sinks serving to connect, at its mounting surface, said circuit board to said main heat sink such that each said sub-heat sink protrudes from said lateral end of said circuit board in a direction parallel to said main surface of said circuit board and is connected to said main heat sink at its protruding portion, and such that said circuit board can be mounted on said main heat sink with said planar main surface facing either toward or away from said recessed portion without compromising heat dissipation.

2. A heat sink/circuit board assembly according to claim 1, wherein positioning holes are formed in said protruding portion in a direction perpendicular to said circuit board.

3. A heat sink for use in engaging a circuit board having a main surface thereon with at least one heat generating component connected thereto, the heat sink comprising:
a main heat sink and sub-heat sinks;
said main heat sink having a recessed portion with an inner edge;
each of said sub-heat sinks having a first dissipating surface, a second dissipating surface, a first contact surface and a second contact surface;
said second contact surface of each of said sub-heat sink being capable of substantially contacting an outer edge of the circuit board;
said first contact surface of each of said sub-heat sinks having an area sufficient for mounting substantially entirely thereon a heat generating component; and
each of said sub-heat sinks being removably attached to said inner edge such that said inner edge is in substantial contact with said first dissipating surface in a first orientation and with said second dissipating surface in an opposite orientation without compromising the dissipation of heat from the heat generating component, through said sub-heat sink and to said main heat sink.

4. A heat sink according to claim 3, wherein positioning holes are formed perpendicularly through said first and second dissipating surfaces of said sub-heat sinks.

5. A heat sink according to claim 3, wherein each sub-heat sink has a first fin extending along a central axis separating said first contact surface from said first dissipating surfaces and a second fin perpendicularly connected to said first fin dividing said first contact surface into two regions.

6. A heat sink according to claim 1, wherein each sub-heat sink has a first fin extending along a central axis separating said heat receiving surface from said mounting surface and a second fin perpendicularly connected to said first fin dividing said heat receiving surface into two regions.

* * * * *